United States Patent
Nayfeh et al.

(10) Patent No.: US 9,263,600 B2
(45) Date of Patent: Feb. 16, 2016

(54) SILICON NANOPARTICLE PHOTOVOLTAIC DEVICES

(75) Inventors: Munir H. Nayfeh, Urbana, IL (US);
Matthew Stupka, Urbana, IL (US);
Turki Al Saud, Riyadh (SA);
Mohammad Alsalhi, Riyadh (SA)

(73) Assignee: The Board of Trustees of the University of Illinois, Urbana, IL (US)

( * ) Notice: Subject to any disclaimer, the term of this patent is extended or adjusted under 35 U.S.C. 154(b) by 1560 days.

(21) Appl. No.: 12/084,611

(22) PCT Filed: Nov. 9, 2006

(86) PCT No.: PCT/US2006/043808
§ 371 (c)(1),
(2), (4) Date: May 4, 2009

(87) PCT Pub. No.: WO2008/051235
PCT Pub. Date: May 2, 2008

(65) Prior Publication Data
US 2009/0308441 A1 Dec. 17, 2009

Related U.S. Application Data

(60) Provisional application No. 60/736,139, filed on Nov. 10, 2005.

(51) Int. Cl.
*H01L 31/055* (2014.01)
*H01L 31/0384* (2006.01)
*H01L 31/0216* (2014.01)

(52) U.S. Cl.
CPC ...... *H01L 31/02167* (2013.01); *H01L 31/0384* (2013.01); *H01L 31/055* (2013.01); *Y02E 10/52* (2013.01)

(58) Field of Classification Search
CPC .............. H01L 31/02167; H01L 31/0384; H01L 31/055; Y02E 10/52
USPC ........ 136/243, 246, 247, 248, 250, 252, 254, 136/255, 256, 257, 258, 259, 260, 261
See application file for complete search history.

(56) References Cited

U.S. PATENT DOCUMENTS 3,811,954 A * 5/1974 Lindmayer ............... 136/256
4,816,324 A * 3/1989 Berman ................... 428/216
(Continued)

FOREIGN PATENT DOCUMENTS

| WO | WO 2007/016080 | 2/2007 |
| WO | WO 2007/018959 | 2/2007 |
| WO | WO 2008/051235 | 5/2008 |

OTHER PUBLICATIONS

Joachim Muller, Bernd Rech, Jiri Springer, and Milan Vanecek, "TCO and light trapping in silicon thin film solar cells", Solar Energy, Available online Apr. 20, 2004, vol. 77, p. 917-930.*
(Continued)

*Primary Examiner* — Marla D McConnell
(74) *Attorney, Agent, or Firm* — Greer, Burns & Crain, Ltd.

(57) ABSTRACT

A photovoltaic device for converting light into electrical power includes a film (16, 26, 36) of silicon nanoparticles. The silicon nanoparticle film, which can be a multilayer film, has a photoluminescence response and couples light and or electricity into semiconductor layers. A particular example photovoltaic device of the invention include a solar cell that accepts and converts light of a predetermined wavelength range into electrical power. A film containing luminescent silicon nanoparticles is optically coupled to the solar cell. The film has a predetermined thickness. The film responds to incident radiation and produces light or electron response in the predetermined wavelength range that is optically coupled into the solar cell. In preferred embodiments, the film is additionally or alternatively electrically coupled to the solar cell, which produces charge response that is electrically coupled into the solar cell.

8 Claims, 13 Drawing Sheets

(56) References Cited

U.S. PATENT DOCUMENTS

| | | | |
|---|---|---|---|
| 5,211,761 | A | 5/1993 | Noguchi et al. |
| 5,866,471 | A * | 2/1999 | Beppu et al. ............ 438/502 |
| 6,410,934 | B1 | 6/2002 | Nayfeh et al. |
| 6,456,423 | B1 | 9/2002 | Nayfeh et al. |
| 6,585,947 | B1 | 7/2003 | Nayfeh et al. |
| 6,597,496 | B1 | 7/2003 | Nayfeh et al. |
| 6,660,152 | B2 | 12/2003 | Nayfeh et al. |
| 6,743,406 | B2 | 6/2004 | Nayfeh et al. |
| 6,846,474 | B2 | 1/2005 | Nayfeh et al. |
| 6,852,443 | B1 | 2/2005 | Ohlsen |
| 6,984,842 | B1 | 1/2006 | Nayfeh et al. |
| 6,992,298 | B2 | 1/2006 | Nayfeh et al. |
| 7,001,578 | B2 | 2/2006 | Nayfeh et al. |
| 7,429,369 | B2 | 9/2008 | Nayfeh et al. |
| 2003/0056820 | A1 * | 3/2003 | MacDonald ............ 136/247 |
| 2003/0178571 | A1 * | 9/2003 | Nayfeh et al. ............ 250/372 |
| 2004/0109666 | A1 | 6/2004 | Kim, II |
| 2004/0126582 | A1 | 7/2004 | Ng et al. |
| 2004/0197255 | A1 | 10/2004 | Nayfeh et al. |
| 2004/0229447 | A1 | 11/2004 | Swihart et al. |
| 2005/0062041 | A1 * | 3/2005 | Terakawa et al. ............ 257/53 |
| 2005/0072679 | A1 | 4/2005 | Nayfeh |
| 2005/0166953 | A1 * | 8/2005 | Baldeschwieler ............ 136/246 |
| 2006/0019466 | A1 | 1/2006 | Nayfeh et al. |
| 2006/0213779 | A1 | 9/2006 | Nayfeh |
| 2009/0090893 | A1 | 4/2009 | Nayfeh |
| 2009/0102353 | A1 | 4/2009 | Nayfeh |

OTHER PUBLICATIONS

V. Svrcek, A. Slaoui, J-C. Muller, "Silicon Nanocrystals—A luminescence converter applied to silicon solar cells", 3rd World Conference on Photovoltaic Energy Conversion, May 11-18, 2003, SIP-A7-16, p. 2734-2737.*

Becca Jones, Mike Scarpulla, Jessy Baker, Kevin Sivula, and Kirstin Alveri, Internet-posted study by Berkeley research students entitled "Nanocrystalline Luminescent Solar Converters", C226 Photovoltaic Materials, Dated Dec. 6, 2004.

G. Kopitkovas, I. Mikulskas, K.Grigoras, I.Đimkienë, R.Toma Điūnas, "Solar cells with porous silicon: modification of surface recombination velocity," *Appl. Phys. A*, vol. 73, pp. 495-501 (2001).

R J Martín-Palma, L Vázquez, J M Martínez-Duart, M Schnell and S Schaefer, "Antireflective porous-silicon coatings for multicrystalline solar cells: the effects of chemical etching and rapid thermal processing", , *Semicond. Sci. Technol.*, vol. 16, pp. 657-661 (2001).

V. Svrč, A. Slaoui, J.-C. Muller,*Thin Solid Films*, 451-452, 384-388 (2004)).

Yerokhov V.Y.; Melnyk I.I., "Porous silicon in solar cell structures: a review of achievements and modern directions of further use," *Renewable and Sustainable Energy Reviews 3*, vol. 32, pp. 291-322 (1999).

* cited by examiner

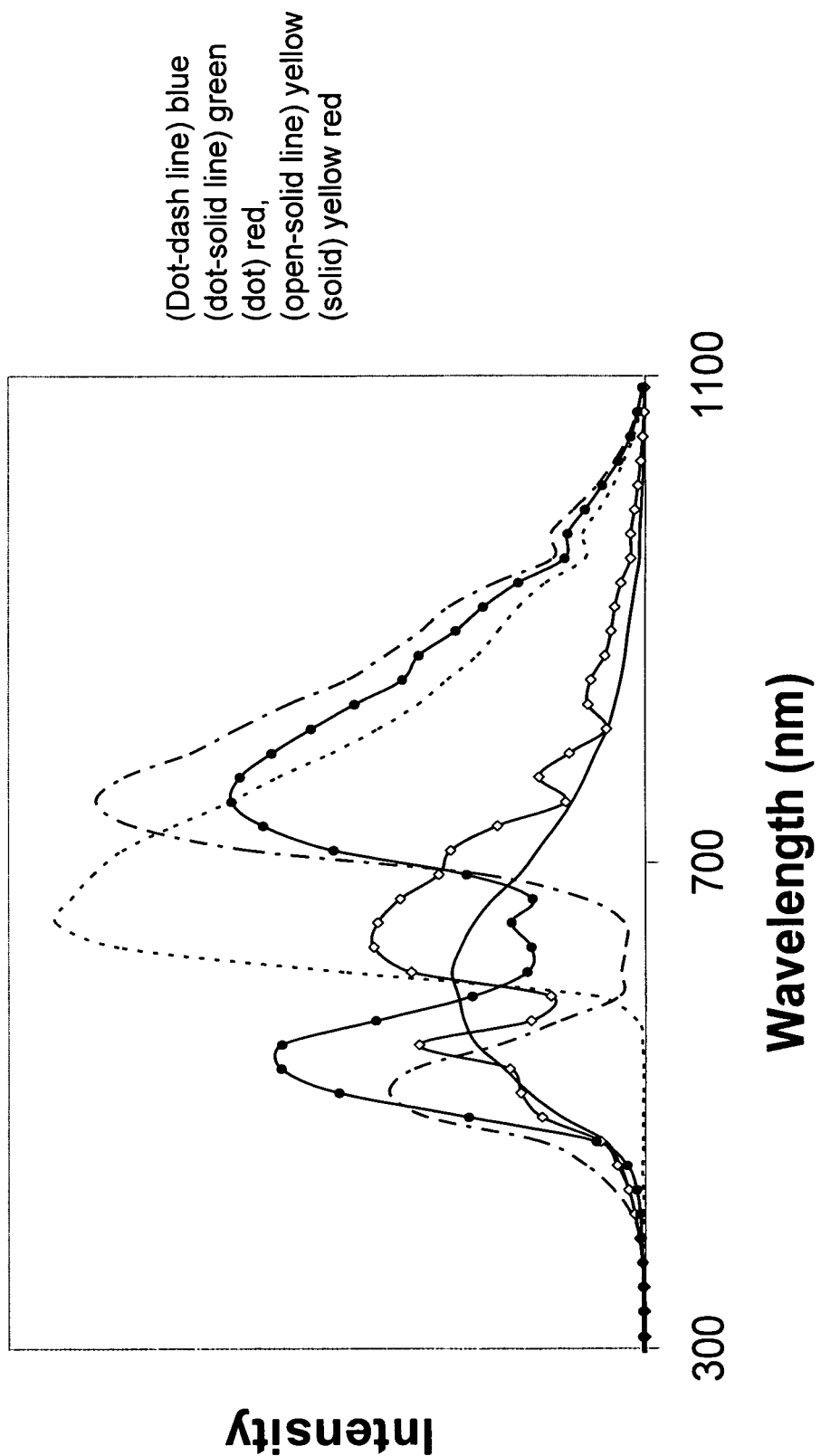

SILICON NANOPARTICLE PHOTOVOLTAIC DEVICES

REFERENCE TO PRIOR APPLICATION AND PRIORITY CLAIM

This application claims priority under 35 U.S.C. §119 from prior provisional application Ser. No. 60/736,139, which was filed Nov. 10, 2005.

STATEMENT OF GOVERNMENT INTEREST

This invention was made with government assistance under Contract Number BES-0118053 awarded by the National Science Foundation. The Government has certain rights in the invention

TECHNICAL FIELD

The field of the invention is photovoltaic devices.

BACKGROUND ART

Photovoltaic devices convert light to electrical potential. Solar cells are common photovoltaic devices in widespread use for converting light energy to electrical potential. Present uses of solar cells are limited by the inefficiency of solar cells. Typical crystalline solar cells have an efficiency of ~15% under 1.35 kW/m$^2$ space illumination. The best commercial cells have an efficiency of 19%.

Solar cells provide small voltage potentials in small scale applications, such as MEMs devices. Usefulness is limited by the inefficiency, however. The low levels of efficiency also make solar cells difficult to implement in portable power sources for generation of electricity that might be used in any number of portable devices requiring a portable power source.

For large scale energy production, such as sources for electrical generation, the low efficiency of present solar cells makes their use cost prohibitive compared to traditional sources used to generate electricity. With direct sun photovoltaic (PV) power and current solar cell technology, costs far exceed the costs of generating electricity from fossil fuels. A goal of current research efforts is lowering the cost of producing electricity from sunlight from solar cells to make generation more comparable in cost to generation of power from fossil fuels.

The principal problem in commercial silicon (Si) solar cells is that less than 40% of sun light effectively couples to the Si semiconductor that forms the basis of commercial photovoltaic cells. A silicon solar cell converts sunlight energy into direct-current (DC) electrical energy by the photovoltaic effect. As sunlight impinges on the top surface of a silicon crystal film, the incident light energy is used in freeing electrons from silicon atoms, allowing them to wander inside the crystal. By special contact designs, those electrons are harnessed as an electric current for operation of an electronic instrument or appliance.

Other photovoltaic semiconductors include cadmium telluride (CdTe), and copper indium diselenide (CuInSe$_2$). Semiconductors applied as thin films on a variety of inexpensive backings have been studied. Examples of PV products using thin film technology include photovoltaic roofing shingles and lightweight flexible panels used by backpackers and boaters.

Silicon-based PV is the most attractive material system because Si is the most abundant material and it is the least toxic of all. In addition, Si offers the opportunity for integration of solar power sources in silicon fabricated electronic devices, which remains the most widely used semiconductor fabrication material.

Silicon is inefficient as a photovoltaic converter. It has an indirect band gap material with a gap of 1.1 eV. Thus, long-wavelength infrared light of photon energy less than 1.1 eV (wavelength larger than 1.124 μm) does not have the threshold energy needed to free electrons from the Si atoms. In addition, deep red radiation converts mostly to heat in the cell. On the other hand, short wavelength light such as that in the ultraviolet part of the spectrum has more than enough energy to create electron hole pairs. The excess energy is transferred to the charge carriers and is dissipated as heat.

Crystalline silicon has a relatively low absorption coefficient, between $10^2$ and $10^4$ cm$^{-1}$, which means that a thickness of about 200 μm is necessary to absorb most of the sunlight. However, efficient collection of the current is hampered by thick cells. The problem of providing sufficient light absorption in thin silicon has been an area of research. An example technique of texturing the surface of the solar cell has showed that cells that are as thin as 50 μm can be efficient.

Proposed techniques to increase efficiency of solar cells, in many cases, have had poor results. Despite many research efforts, a practical technique that is commercially feasible is still lacking. One Internet-posted study by Berkeley research students Becca Jones, Mike Scarpulla, Jessy Baker, Kevin Sivula, and Kirstin Alveri entitled "Nanocrystalline Luminescent Solar Converters", C226 Photovoltaic Materials, Dated Dec. 6, 2004, describes study of techniques for coupling short wavelength light into a solar cell. The study describes the coating of a layer of CdSe/CdS core/shell nanorods onto a high-efficiency PV cell manufactured by Sunpower Corp to increase efficiency. No increase in efficiency was reported. The researchers recommended further research with conventional silicon PV cells with the nanorods embedded in transparent medium such as a glass or a transparent oxide or nitride layer.

United States Published Patent Application US2004/0126582, Jul. 1, 2004, discloses the use of an organic polymer to disperse nanoparticles, including silicon nanoparticles. The silicon nanoparticles are embedded in polymer matrix that is used to prevent aggregation of the particles or formation of closely-packed films. A solar cell is described with one or a series of polymer layers with dispersed nanoparticles therein, including layers having different sized luminescent silicon nanoparticles, with characteristic red, green and blue luminescent responses.

Others have proposed a porous silicon layer with its silicon nanostrucures as an active layer to be layered over a silicon solar cell. The use of porous layers, however, lacks control over the nanostructure distribution; it normally consists of a random and wide distribution in size and shape extending to sizes of tens of nanometers, which limits charge separation and collection or light propagation across the film. Also, porous layers are thick layers that might interfere with the operation of the underlying cell. At present, acceptable results are obtained for the use of porous Si as antireflecting coating for Si solar cells only. (See, e.g., "Porous silicon in solar cell structures: a review of achievements and modern directions of further use," Yerokhov V. Y.; Melnyk I. I., Renewable and Sustainable Energy Reviews 3, 291-322(32), (1999); "Antireflective porous-silicon coatings for multicrystalline solar cells: the effects of chemical etching and rapid thermal processing, R J Martin-Palma, L Vázquez, J M Martinez-Duart, M Schnell and S Schaefer," *Semicond. Sci. Technol.* 16 657-661 (2001); G. Kopitkovas, I. Mikulskas, K. Grigoras, I.

Đimkienë, R. Tomašiûnas, "Solar cells with porous silicon: modification of surface recombination velocity," Appl. Phys. A 73, 495-501 (2001).

In another proposed technique (see, e.g., V. Švrček, A. Slaoui, J.-C. Muller Thin Solid Films, 451-452, 384-388 (2004)) for improving solar cell efficiency, silicon nanocrystals were prepared ex situ (pulverizing of electrochemical etched porous silicon) and were embedded into a spin-on-glass antireflecting $SiO_2$ based solution and then spun onto standard silicon solar cells. The $Si-nc/SiO_2$ layer was intended to serve as a luminescence down-converter. The influence on solar cell performances (internal quantum efficiency, current-voltage characteristic) was investigated in an indirect manner in terms of destroying the nanoparticles by high temperature to see their effect. An increase in efficiency was reported. However, the obtained contribution from the silicon nanocrystal based system was also reported to be rather weak. This is likely due first to the fact that the fraction of incorporated nanomaterial is limited to a few percent. In other words, a problem with this approach is that the silicon nanoparticles are incorporated in a composite with glass, resulting in a low density of nanoparticles, ~1% of the composite. Second, the size distribution of particles in the composite is wide since present synthesis techniques lack control over size or shape. Third, it is possible that matrix material is not smooth enough to provide optical confinement and index of refraction matching.

DISCLOSURE OF INVENTION

A preferred embodiment photovoltaic device for converting light into electrical power includes a solar cell. In the preferred embodiment, the solar cell accepts and converts light of a predetermined wavelength range into electrical power. A film containing luminescent silicon nanoparticles is optically coupled to the solar cell. The film has a predetermined thickness. The film responds to incident radiation and produces light response in the predetermined wavelength range that is optically coupled into the solar cell. In preferred embodiments, the film is additionally or alternatively electrically coupled to the solar cell, which produces charge response that is electrically coupled into the solar cell.

Another preferred embodiment of the invention uses a silicon nanoparticle film, e.g. a single layer or a multi layer film, to convert light into electricity without a solar cell. In this device, a silicon nanoparticle film electrically contacts and separates two conducting films. The conducting films are substantially transparent and are upon a substrate. The silicon nanoparticle film induces charge in the conducting films.

BRIEF DESCRIPTION OF THE DRAWINGS

FIG. 9A shows the spectra of several light sources that cover the visible range, each provide energy of ~50 W/m² that were used to test experimental prototype solar cells having a 2.85 silicon nanoparticle thin film;

BEST MODE OF CARRYING OUT THE INVENTION

A preferred embodiment photovoltaic device of the invention for converting light into electrical power includes a solar cell. In a preferred embodiment, the solar cell accepts and converts light of a predetermined wavelength range into electrical power. A film containing luminescent silicon nanoparticles is optically coupled to the solar cell. The film has a predetermined thickness. The film responds to incident radiation and produces light response in the predetermined wavelength range that is optically coupled into the solar cell. In preferred embodiments, the film is additionally or alternatively electrically coupled to the solar cell, which produces charge response that is electrically coupled into the solar cell.

Another embodiment of the invention uses a silicon nanoparticle film, e.g. a single layer or a multilayer film, to convert light into electricity without a solar cell. In this device, a silicon nanoparticle film electrically contacts and separates two conducting films. The conducting films are substantially transparent and are upon a substrate. The silicon nanoparticle film induces charge in the conducting films.

A preferred photovoltaic solar cell of the invention uses uniformly sized luminescent silicon nanoparticles to couple short wavelength light and produce electron-hole pairs, within the nanoparticles, which recombine in the nanoparticles to produce visible light. The uniformly sized luminescent silicon nanoparticles are index matched directly with the solar cell since both are made of silicon, permitting high density, closely-packed films directly integrated on the cell.

Methods of fabrication of photovoltaic solar cells of the present invention provide control of the size and shape of the nanoparticles as well as the packing, thickness, and smoothness of the silicon nanoparticle film to be used. The silicon nanoparticle film is highly sensitive to UV radiation, and efficiently down-converts the UV radiation into a solar cell with the luminescent response of the silicon nanoparticle film.

Preferred embodiments will now be discussed with reference of the drawings. Drawing figures include schematic representations that will be understood by artisans. Drawings figures are not to scale, and features may be exaggerated for purposes of illustration. In the detailed description, experimental results will be discussed, and artisans will appreciate broader aspects of the invention from the experiments and data, as well as variations and additional embodiments.

Figure 1A:
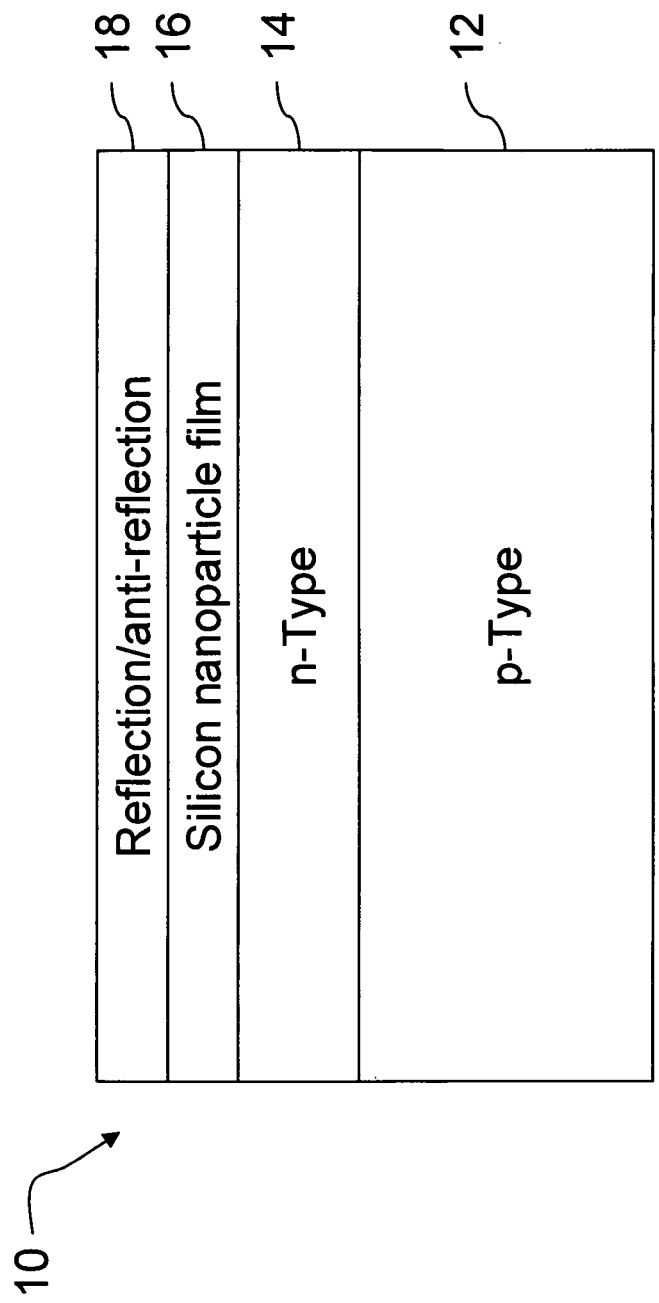
FIG. 1A is a schematic cross-section drawing of a preferred embodiment photovoltaic solar cell of the invention.

FIG. 1A shows a schematic cross-section of a preferred embodiment solar cell 10 of the invention. The solar cell is a crystalline or polycrystalline cell, with a substrate 12 of silicon doped with a small quantity of boron to give it a positive or p-type character (p-type). On top of it there is a thin Si film 14, which is doped, e.g., with phosphorous, to give it a negative or n-type character (n-type). A film of silicon nanoparticles 16 converts radiation that would not excite a response in the p-n junction of the solar cell to visible radiation that excites a response to increase the efficient of the solar cell. Simultaneously, the film converts radiation into positive and negative charge which is separated and collected by the p-n junction.

A reflection/anti-reflection layer 18 can also be used to assist the coupling of additional photoluminescence into the p-n junction. The reflection/anti-reflection layer 18 is tuned (through its material properties) to pass UV light and reflect photoluminescence emitted from the silicon nanoparticle film 16 back into the n-type layer 14.

Figure 1B:
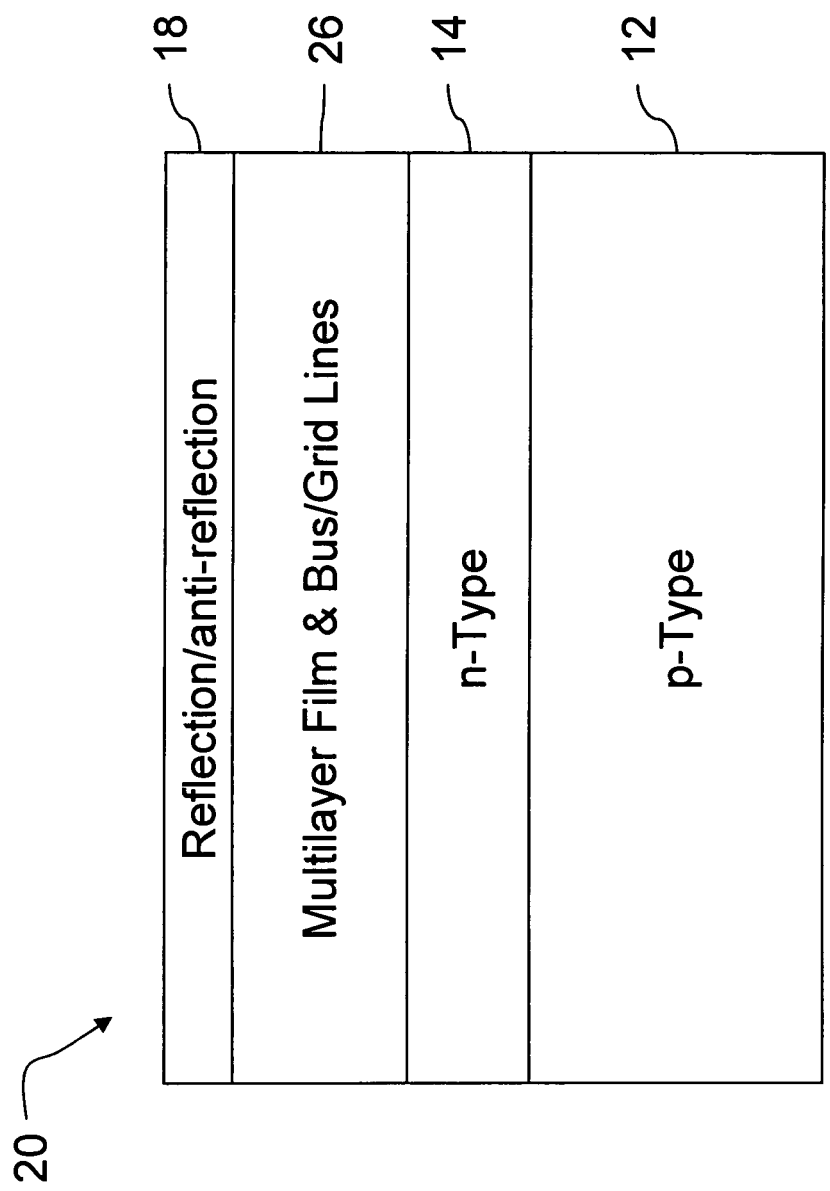
FIG. 1B is a schematic cross-section drawing of another preferred embodiment photovoltaic solar cell of the invention.

FIG. 1B shows another preferred embodiment solar cell 20 of the invention. This involves multiple layers of silicon nanoparticles. In this embodiment, systems of metal grid and bus lines are used to collect the produced charge. The first is laid down on the n-type layer, and then covered with a multilayer film 26 include one or more silicon nanoparticle layers. The multilayer film 26 in the device 20 preferably includes an initial coating of an $Si_3N_4$ layer much thinner than the grid lines, and covered with a film of closely packed silicon nanoparticles. The film of closely packed nanoparticles is topped by a thin layer of Si nitride. The film is electrically connected to the grid. A second set of grid and bus lines isolated from the first are deposited on the nitride followed by a layer of particles of a smaller size and topped with a layer of Si nitride. The procedure may be repeated for two more layers of photoluminescent silicon nanoparticles of smaller sizes. The order of sizes is chosen such that the particle size decreases with distance from the p-n junction. A discretely sized family of silicon nanoparticles is disclosed, for example, in U.S. Pat. No. 6,743,406, Jun. 1, 2004. In addition, the multilayer film 26 can incorporate thin low temperature amorphous silicon layers (5-10 nm), to enhance the response to the visible part of the spectrum.

The grid line interconnects for each layer will be grouped together alternatively by the bus lines to achieve charge separation and summation from the different layers in a cascade configuration. The layer order chosen is such that the size of the particle used decreases from the p-n junction In addition, thin low temperature amorphous silicon layers (10 nm) can also be incorporated in the multilayer system. The device can be annealed at temperatures in the range of 300-400 C to improve all layers.

Figure 1C:
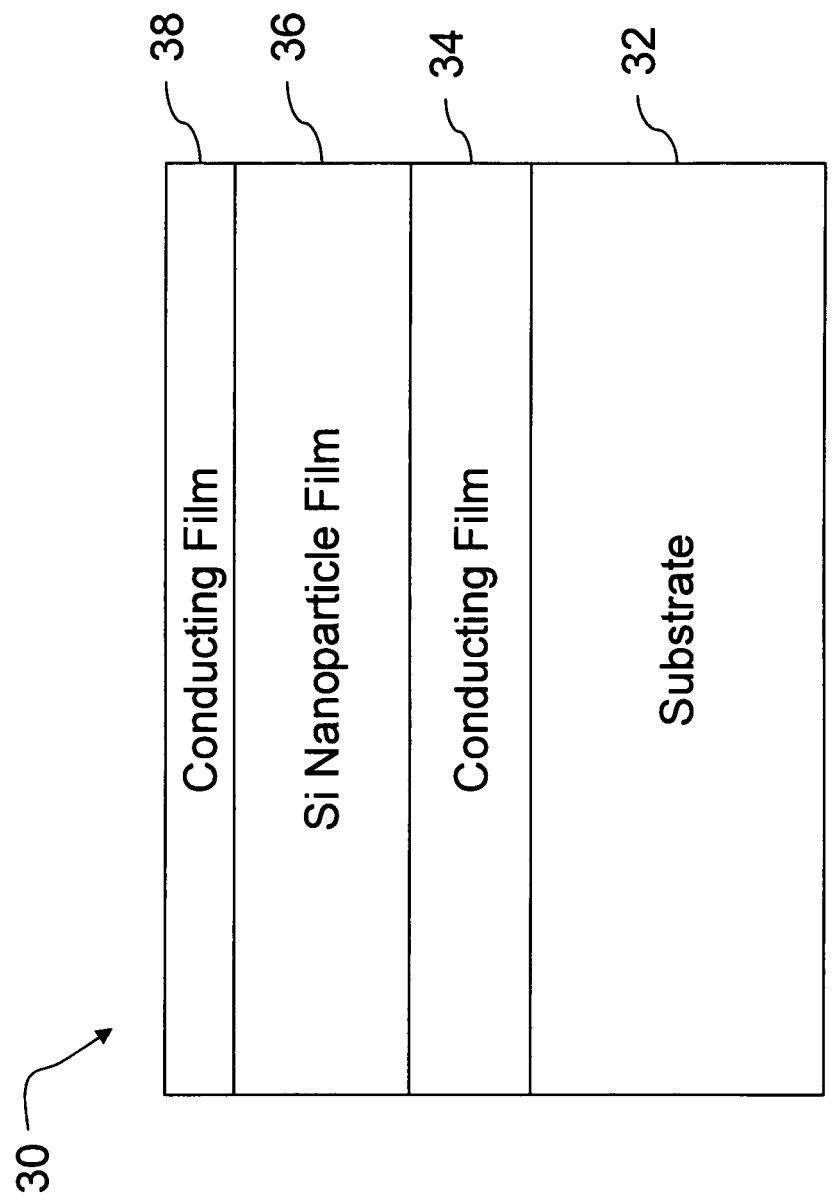
FIG. 1C is a schematic cross-section drawing of another preferred embodiment photovoltaic device of the invention.

FIG. 1C shows another preferred photovoltaic device 30 of the invention. A substrate 32 is conducting or nonconducting substrate coated including a thin transparent conducting film. The substrate 32 is preferably transparent and can be rigid or flexible. In a preferred embodiment, the substrate 32 is glass with a transparent thin conducting film 34, e.g., silver, aluminum, copper, tin, etc. Metal films are transparent or substantially transparent if they are thin enough (~5 nm), and other conductors such as indium tin oxide (ITO) are transparent or substantially transparent in thicker films. A film 36 of photoluminescent silicon nanoparticles from the discrete family of nanoparticles discussed above is upon on the conducting film 34. The film 36 can also be a multilayer film with layers of discretely sized nanoparticles as well as amorphous silicon, as discussed above. Another transparent conducting film 38 that is formed a different metal or another conductive material from the conducting film, e.g., ITO, aluminum, copper, tin, etc. No separate p-n junction is required in the device 30 of FIG. 1C, and electrical current is provided by the conducting films.

An example laboratory prototype embodiment was formed in accordance with the FIG. 1B embodiment, by modifying a conventional commercial solar cell made by BP Solarex. The commercial solar cell was a 12×12 cm sheet. The sheet had ~50 grid lines (2.5 mm spacing) made of silver/copper alloy across the sheet to collect the current. Across the grid lines there are two bus lines (~2 mm width), which are also constructed from silver/copper. The grid and bus line system is designed to deliver the charge which is generated over the whole area of the solar sheet. A single layer of 1 nm silicon nanoparticle was laid down on the cell. The topography of the cell was analyzed by a surface texture measuring system (Dectak); it shows that the thickness of the silver/copper grid lines is larger than that of the nitride coating. Thus the laid down nanocrystal film is not electrically isolated from the underlying device. Finally, the cell is in contact with a heat sink.

Figure 2:
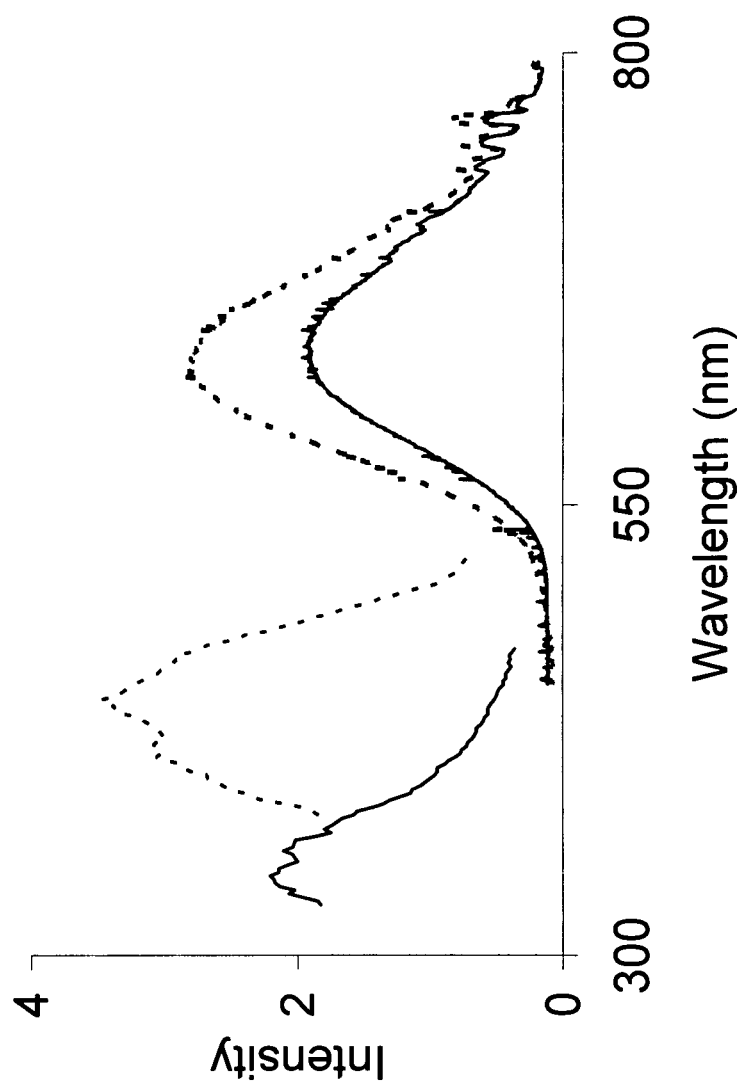
FIG. 2 is a graph of photoluminescence of a 1 nm silicon nanoparticle colloid used to form a silicon nanoparticle thin film to form an experimental prototype photovoltaic solar cell; the colloid response is to irradiation from incoherent light sources at 300 nm and 360 nm.

A colloid substantially consisting of 1 nm silicon nanoparticles was prepared in isopropyl. FIG. 2 gives the photoluminescence of the 1 nm silicon nanoparticle colloid under irradiation from incoherent UV light sources at 300 nm and 360 nm. Since the excitation wavelength is shorter than the emitted wavelength, the spectrum displays the down conversion (from UV into visible radiation).

2×2 cm portions of the solar sheet were isolated. The active region of the solar sheet was covered with a thin film of 1 nm silicon nanoparticles by spreading an amount of particle colloid on the active face. The alcohol was allowed to dry under ambient conditions, resulting in the formation of a thin film of closely packed nanoparticles. Other techniques for application of the 1 nm silicon nanoparticle colloid include spraying, spin coating, and electro-deposition.

The response of the solar cell was measured both prior to formation of the 1 nm silicon nanoparticle film and after its formation. Consistent radiation conditions were created for measurements by keeping the solar cell continuously illuminated under UV light source (for 15-24 hours) in with the relative position of the source and cell kept constant. Additional colloid was then added on the cell and another measurement taken. This procedure was repeated several times to allow direct correlation of the response with the increase in the thickness of the nanoparticle active film.

In each measurement, enough time was allowed for the response to reach steady state. Performance was analyzed by monitoring changes in the open-circuit voltage $V_{oc}$, and the short circuit current $I_{sc}$. Normally, the performance of solar cells is determined by measuring the full current-voltage (I-V) relationships, with $I_{sc}$ and $V_{oc}$ as two important characteristics. On the other hand, one can measure only the $I_{sc}$ and $V_{oc}$ values. The delivered power is computed using the product P=I*V, with the maximum operating power typically given by P ~0.75 $I_{sc}$*$V_{oc}$. Excess thickness hampers light propagation and charge separation and collection.

Figure 3:
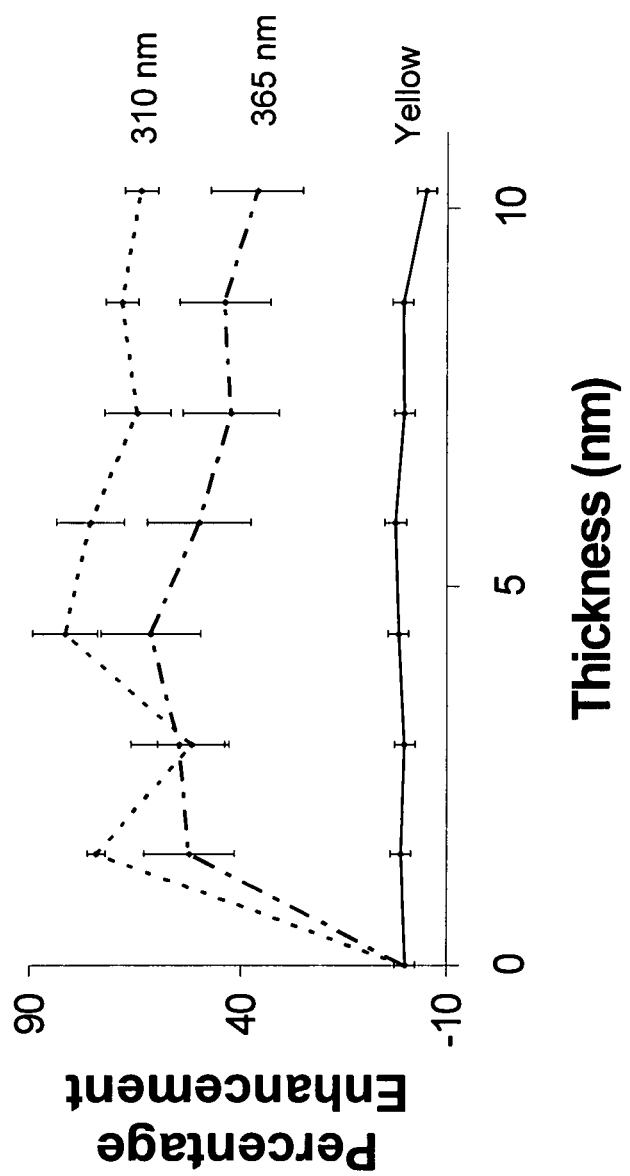
FIG. 3 gives the percentage change in the open circuit voltage $V_{oc}$ response as a function of the thickness of a 1 nm nanoparticle thin film (consisting of 1 nm particles) with irradiation at 310 nm, 365, and 570 nm (yellow) for an experimental prototype photovoltaic solar cell.
Figure 4:
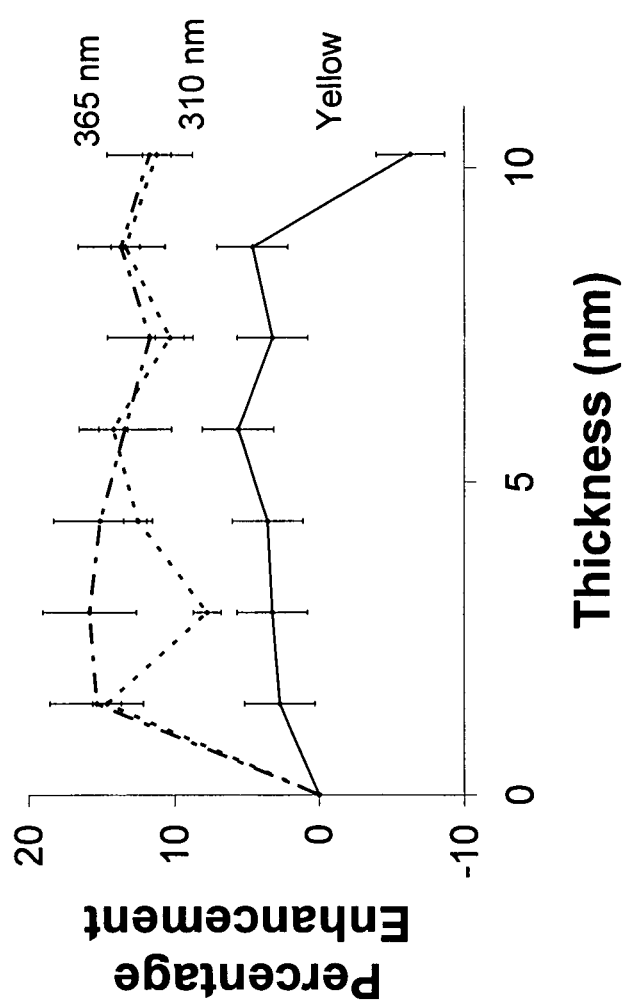
FIG. 4 gives the percentage change in the short circuit current $I_{sc}$ response as a function of the thickness of the 1 nm nanoparticle thin film (consisting of 1 nm particles) with irradiation at 310 nm, 365, and 570 nm (yellow) for the 1 nm nanoparticle film experimental prototype photovoltaic solar cell.

We measured here only the $I_{sc}$ and $V_{oc}$ values. FIG. 3 gives the percentage change in the open circuit voltage $V_{oc}$ response as a function of the thickness of the blue nanoparticle film (consisting of 1 nm particles) with irradiation at 310 nm, 365, and 570 nm (yellow). FIG. 4 gives the percentage change in the short circuit current $I_{sc}$ response as a function of the thickness of the blue nanoparticle film (consisting of 1 nm particles) with irradiation at 310 nm, 365, and 570 nm (yellow). As indicated in FIGS. 3 and 4, the response of the solar cell first increases in correlation with the increase in the thickness of the nanoparticle film, but then flattens and may begin to drop at large thickness.

The thickness of the film was estimated from the concentration, volume of liquid that was dispensed, and the active area. In each measurement, enough time was allowed for the film to dry and the nanoparticles to form close packing with very little alcohol remaining. Moreover, enough time was allowed such that the response reaches steady state conditions. Increases in $V_{oc}$ by more than 60% are observed in the range 310 nm and 365 nm. Measurements show only ~14-17% increase in $I_{sc}$. This gives a power enhancement of ~62%.

The efficiency can be further increased for UV applications with the silicon nanoparticle film by better collection and trapping of the light produced by the nanoparticles. In the experiments described above, bare films were used without optimizing light coupling, luminescence collection, or index matching. Efficiency can be improved by coating the nanoparticle film with a film that passes UV light while reflecting the photoluminescence to the solar cell surface.

The example laboratory prototype was also tested under visible radiation band covering the range 560-630 nm (~400 W/m²). FIGS. 3-4 show that the measured $V_{oc}$ response does not exhibit measurable enhancement or reduction while there is a slight increase of 4% in $I_{sc}$, resulting in a power enhancement of ~3%.

This is consistent with the fact that the 1 nm silicon nanoparticle has a large absorption edge (bandgap) of ~3.6 eV, hence the film constitutes a wide band gap material that is essentially transparent in the visible part of the spectrum. The response in the visible was also found to be stable under intense UV irradiation over several days. Thus, the film acted as an active filter that protected the cell from UV, which prolongs the working life. The stability is a direct result of the high photostability of the constituent nanoparticles.

Figure 5:
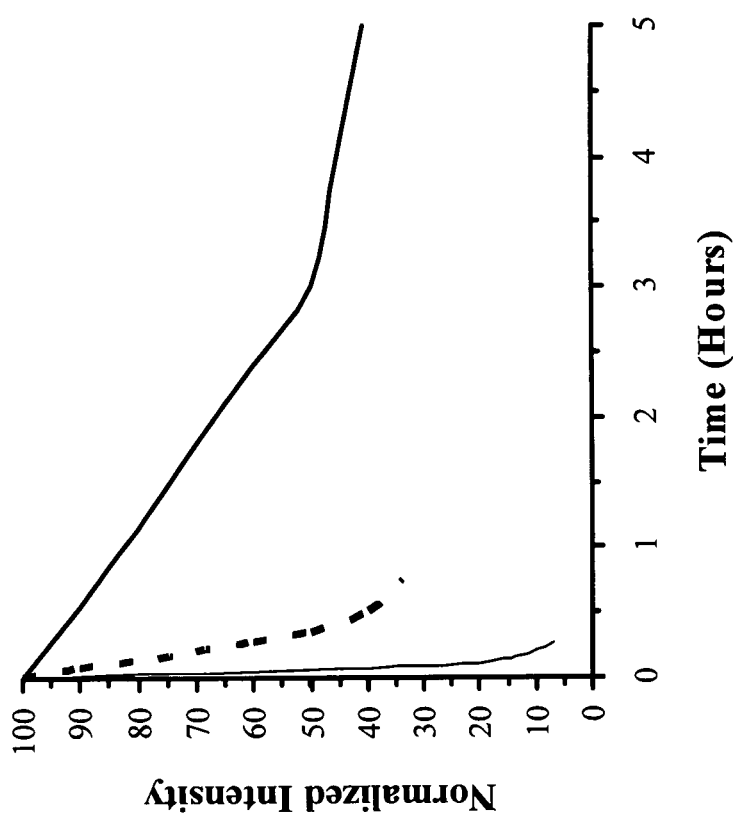
FIG. 5 plots long-term stability of the silicon nanoparticles in solution (solid line) under UV radiation compared to blue dyes (dash and light solid)

The film was also found to be photostable under UV irradiation. The stability is a direct result of the photostability of the particles. The degradation of the cells under normal UV radiation conditions from an incoherent lamp such as a UV mercury lamp is extremely slow. To accelerate the measurement an intense laser beam was used for testing. The photostability of the 1 nm particles was observed in static colloids under nanosecond 354 nm UV laser excitation. Particles were irradiated in colloids with 10 W/cm² at 354 nm using an Nd-Yag laser, nearly 5000 fold stronger than the incoherent UV mercury source used in testing the cells or what is expected from direct exposure to UV sun light. FIG. 5 (heavy solid) displays the long-term stability of the particles compared to two types of blue dyes dissolved in a liquid (dash and light solid). After an initial drop over the first few hours of irradiation, the luminescence develops long-term stability at the 50% level. Under the same conditions, common dyes, such as coumarin and stilbene quench with rates 8 and 50 faster, and exhibit no long-term stability. Based on these measurements, we believe it will take the film more than 2 years to get to the 50% stability level.

The good performance, both in the UV and visible, is likely attributable to the fact that the film was applied to the cell directly without using a glass or polymer matrix, and the fact that the fluorescent silicon nanoparticles are highly uniform in size, consisting substantially of identical particles of a single size, which leads to self-assembly of smooth films. These characteristics provide better optical confinement and index of refraction matching, as well as reduced scattering or fluorescence losses.

Figure 6:
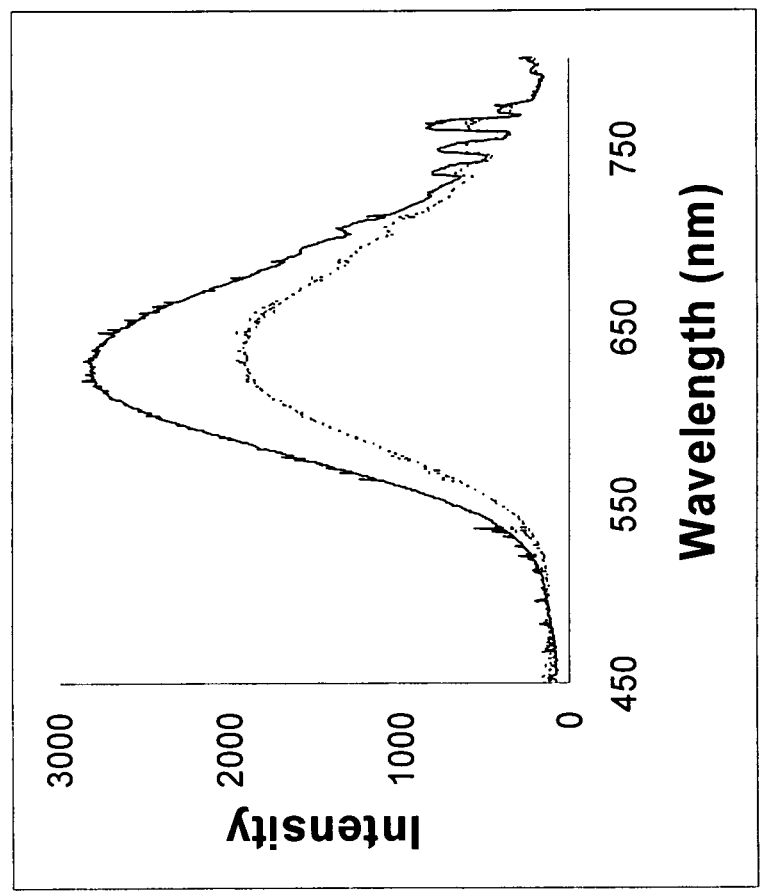
FIG. 6 is a graph of photoluminescence of a 2.85 nm silicon nanoparticle colloid used to form a silicon nanoparticle thin film to form an experimental prototype photovoltaic solar cell; the colloid response is to irradiation from incoherent light sources at 254 nm and 310 nm.

Example laboratory prototypes were also prepared with thin silicon nanoparticle films prepared from a colloid of nanoparticles consisting essentially of red fluorescent nanoparticles of 2.85 nm in diameter. The fluorescence spectrum of the alcohol colloid of the red particles under irradiation at 254 and 310 nm is shown in FIG. 6 (solid, and dot—not to scale). The luminescence is an orange/red band with a peak at 630 nm. Due to a bandgap of 2.11 eV, the colloid also produces red luminescence with 550 nm excitation.

Figure 7:
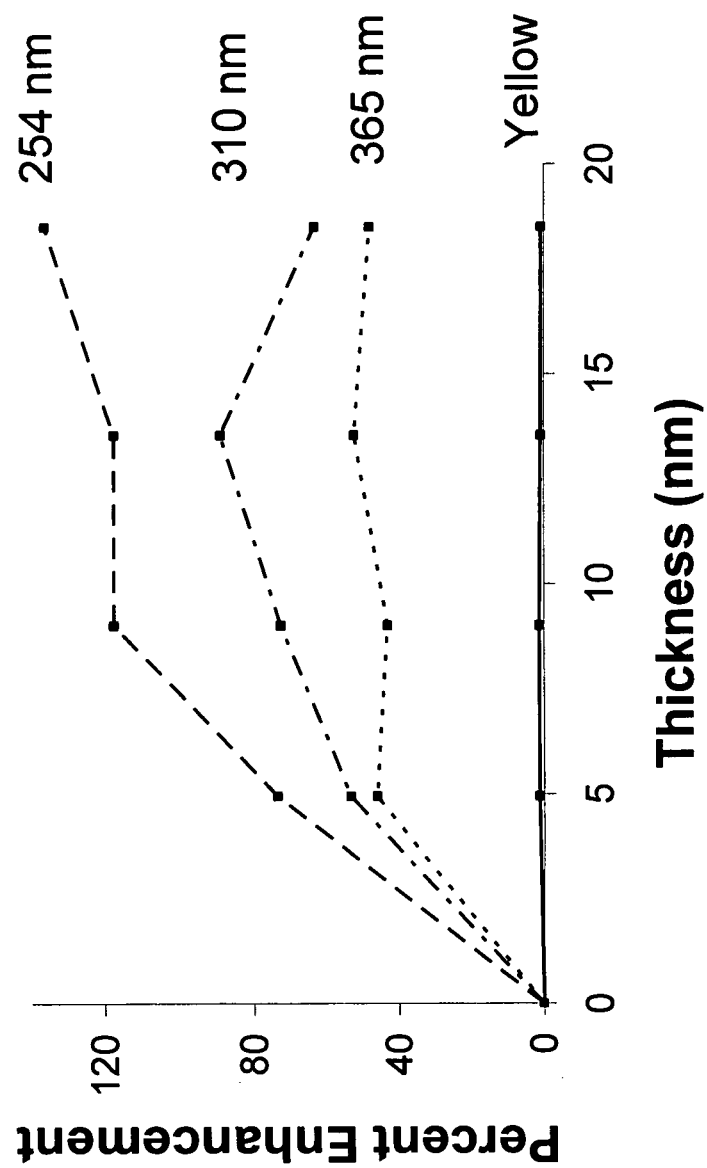
FIG. 7 gives the percentage change in the voltage response $V_{oc}$ as a function of the thickness of the 2.85 nm red nanoparticle film with irradiation at 254 nm, 310 nm, 365, and 570 nm (yellow) for an experimental prototype photovoltaic solar cell.

FIG. 7 presents the percentage change in the voltage response of an experimental prototype photovoltaic cell $V_{oc}$ with the thickness of the nanoparticle red nanoparticle film with irradiation at 254 nm, 310 nm, 365, and 570 nm (yellow-red). FIG. 7 shows $V_{oc}$ is enhanced by more than ~80% in the UV.

Figure 8:
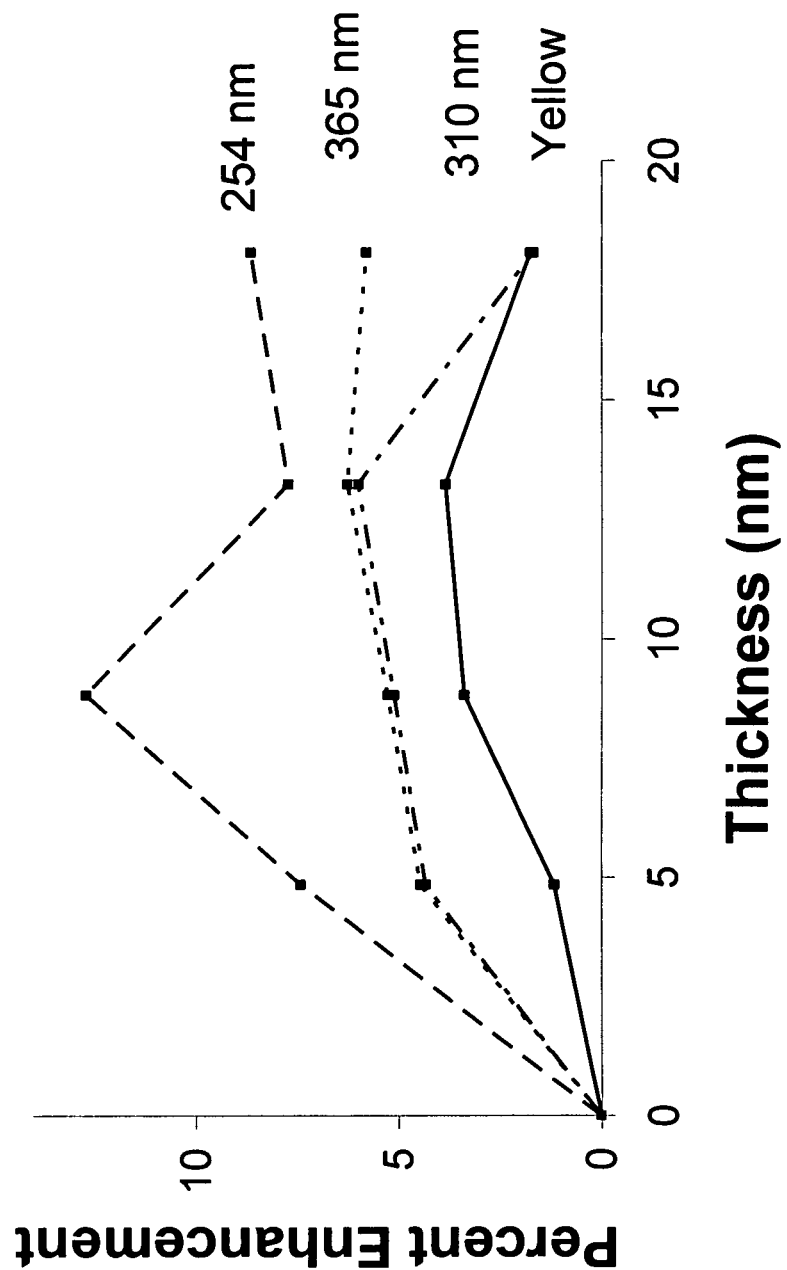
FIG. 8 gives the percentage change in the short circuit current $I_{sc}$ response as a function of thickness at 254 nm and 310 nm, 365, and 570 nm (yellow) for the 2.85 nm nanoparticle film experimental prototype photovoltaic solar cell.

FIG. 8 shows the $I_{sc}$ with thickness at 255 nm, 310 nm, 365 nm, and 570 nm (yellow). The figure shows a slight increase of 5% in $I_{sc}$. The overall power enhancement is ~67%.

Figure 9B:
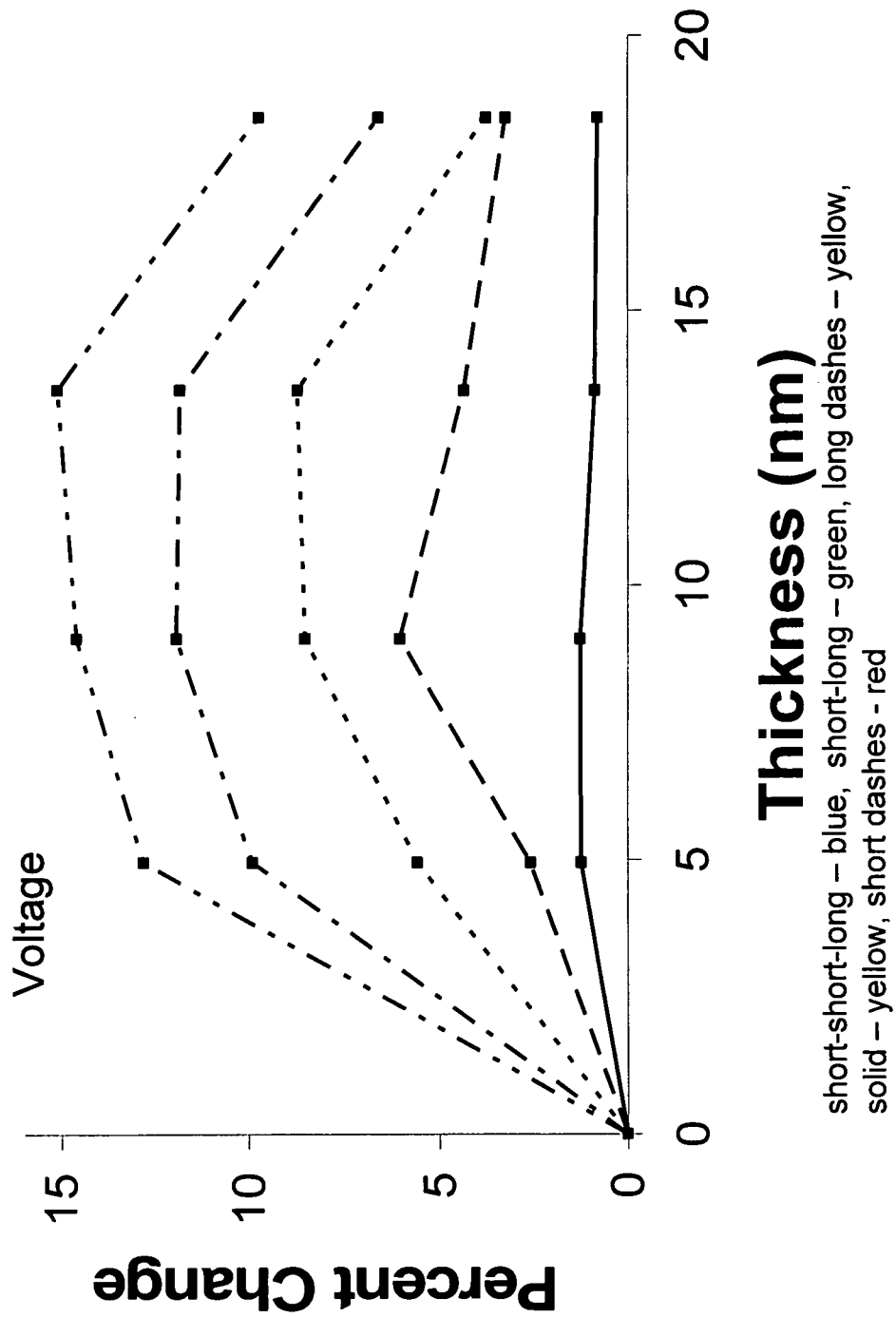
FIGS. 9B-9C respectively illustrate the open circuit voltage response and short circuit current response of the experimental prototype solar cells illuminated with the spectra of FIG. 9A.
Figure 9C:
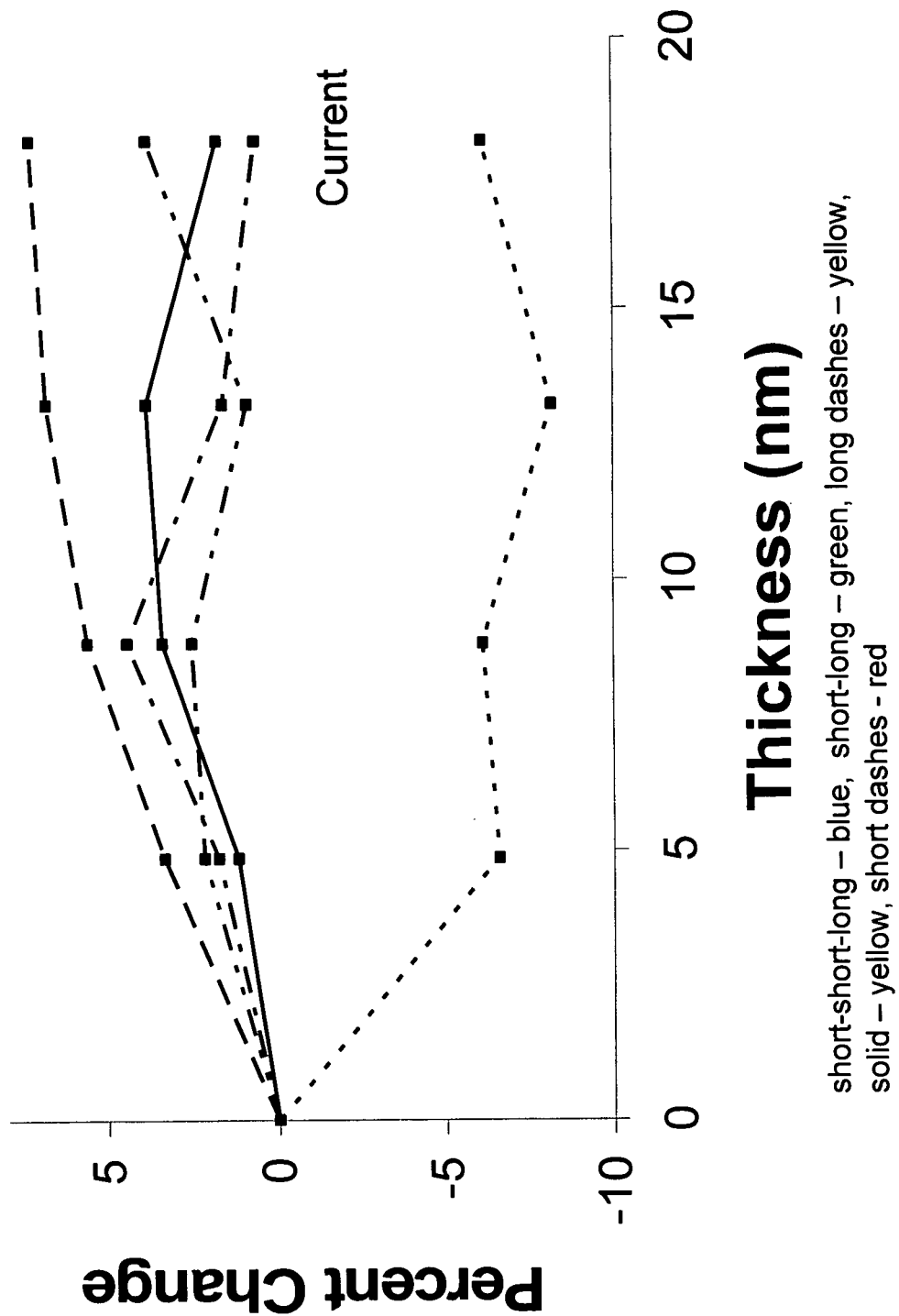

The response of the experimental prototype 2.85 silicon nanoparticle solar cells was also measured using several light sources that cover the visible range, each provide energy of ~50 W/m² to the experimental prototype solar cells. The optical spectra of the sources are shown in FIG. 9A. The results for a nanofilm of 2.85 nm particles are shown in FIGS. 9B-9C. $V_{oc}$ exhibits an enhancement of 10-15% especially under blue-green part of the spectrum, while $I_{sc}$ exhibits an increase less than 5%. This results in a power enhancement of 7.5-13.5%. This shows that the response of the red particles in the visible is more efficient than the blue particles. This may be due to the fact that the red particles have a confinement bandgap of 2.15 eV (in the visible at ~570 nm excitation), compared to 3.5 eV (in the UV at ~354 nm excitation) for the 1 nm particles. The confinement bandgap may result in an enhancement of response for excitation at wavelength shorter than 570 nm. On the other hand, both respond well to the UV due to the dominating direct band gap of bulk at 3.2-3.4 eV.

It is also noted that the active nanoparticle film not only improves the conversion but it also act as a filter that protects the solar cell from the UV absorption that may cause some damage and shorten the working life of the overall cell. In other words, less UV striking the n-p solar cell reduces the heat generated in the cell and hence prolongs the working life of the cell.

The response of the sheet, as a function of the wavelength of the incident radiation, was used to obtain the conversion quantum yield. Near full UV absorption in the film was assumed at optimal response. For the 1 nm particles, the quantum yield is ~0.48, 0.82, 0.56 for excitation at 254, 310, and 365 nm respectively. The 2.85 nm red particles exhibit a yield of ~0.22, 0.36, and 0.5 respectively.

The enhancement can be analyzed in terms of wavelength conversion and/or in terms of charge transport and separation in the film. It is known that thin films of silicon nanoparticles efficiently convert UV wavelengths to visible wavelengths, as well as efficiently generate electron-hole pairs (excitons), both of which may contribute to device enhancement. Also, in such ultrasmall nanoparticles, non-radiative recombination is much slower than radiative recombination due to strong confinement. For 1 nm particles, the increase in the short circuit current of 17% in experimental prototype solar cells of the invention can be attributed to efficient conversion of visible photoluminescence despite the fact that the film reduces the light intensity reaching the cell. Since voltage in such devices increases logarithmically with the current, the corresponding voltage increase using a standard solar cell relation between $V_{oc}$ and $I_{sc}$ was determined. The increase in voltage was only 30%, however, short of the measured enhancement (60-70%). For the 2.85 nm particles, the 5% increase in the current is much too small to account for the 80% voltage enhancement. The enhancement in the voltage may also be due in part to charge separation and collection.

The silver/copper grid lines provide electrical contact with the nanocrystal film, establishing a Schottky-like rectifying junction at this contact. Fast diffusing electrons can then accumulate in the diode-like junction. If the much slower diffusing holes dissipate via charge traps in the low quality nitride thin layer, then negative and positive charges separate and accumulate. This can create a potential difference that augments the potential difference $V_{oc}$ of the polycrystalline cell. The nanofilm, in this regard, may perform as an active top cell configuration. Studies in equivalent films that were used in UV photodetection showed that charge separation and electronic transport across the films is fast and governed by resonant quantum mechanical tunneling.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A photovoltaic device for converting light into electrical power, comprising:
    means for accepting and converting light of a predetermined wavelength range into electrical power; and
    a film consisting substantially of luminescent silicon nanoparticles optically coupled to said means for accepting and converting light, said film having a predetermined thickness, said film responding to incident radiation and producing light response in the predetermined wavelength range that is optically coupled into said means for accepting and converting light.

2. The photovoltaic device of claim 1, further comprising means for reflecting a misdirected portion of the light response in the predetermined wavelength range in a direction to be coupled into said solar cell means.

3. A photovoltaic device for converting light into electrical power, comprising:
    a solar cell; and
    a film consisting substantially of luminescent silicon nanoparticles optically coupled to said solar cell.

4. The photovoltaic device of claim 1, comprising a multilayer film including nitride, amorphous silicon and said film consisting substantially of luminescent silicon nanoparticles.

5. The device of claim 3, wherein said solar cell includes a grid and bus collection system and the film consisting substantially of luminescent silicon nanoparticles directly electrically contacts the grid and bus collection system.

6. A photovoltaic device for converting light into electrical power, comprising:
    a solar cell; and
    a film consisting essentially of luminescent silicon nanoparticles optically coupled to said solar cell.

7. A photovoltaic device for converting light into electrical power, comprising:
    a solar cell; and
    a film consisting of luminescent silicon nanoparticles optically coupled to said solar cell.

8. The device of claim 1, wherein said film consisting substantially of luminescent silicon nanoparticles is between ~2.5 and ~17.5 nm thick.

* * * * *